United States Patent [19]
Johnston

[11] Patent Number: 6,031,196
[45] Date of Patent: Feb. 29, 2000

[54] PUSH BUTTON SWITCHING SYSTEM AND METHOD

[75] Inventor: Mervyn Bradshaw Johnston, Easton, Md.

[73] Assignee: Dresser Industries, Inc., Dallas, Tex.

[21] Appl. No.: 09/283,725

[22] Filed: Apr. 1, 1999

Related U.S. Application Data

[62] Division of application No. 09/190,998, Nov. 12, 1998, Pat. No. 5,941,372.

[51] Int. Cl.[7] .................................................. H01H 13/70
[52] U.S. Cl. ............................................ 200/343; 200/340
[58] Field of Search .................................... 200/517, 340, 200/343

[56] References Cited

U.S. PATENT DOCUMENTS

| | | | |
|---|---|---|---|
| 5,422,447 | 6/1995 | Spence | 200/5 A |
| 5,776,283 | 7/1998 | Kato | 156/249 |
| 5,909,021 | 6/1999 | Duffy | 200/514 |

FOREIGN PATENT DOCUMENTS

| | | | |
|---|---|---|---|
| 1163425 | 2/1964 | Germany . | |
| 2331065 | 5/1975 | Germany | 200/339 |
| WO 84/01051 | 3/1984 | WIPO | 200/517 |

*Primary Examiner*—Michael L. Gellner
*Assistant Examiner*—Nhung Nguyen
*Attorney, Agent, or Firm*—Haynes and Boone, L.L.P.

[57] ABSTRACT

A push button switch assembly and method according to which a button is mounted to a partition and has at least one hook for engaging a ledge of the partition. At least one post extends from the button and through an opening in the partition and is fastened to the partition for mounting the button to the partition for pivotal movement which is limited by the engagement of the hook with the ledge. A membrane switch is mounted on the partition, and a bumper extends from the button for engaging the membrane of the switch to activate same. The bumper is fabricated from a silicone rubber to minimize the effects of relatively large pushing forces acting on the button and to enable the assembly to be used in relatively low temperature environments.

15 Claims, 2 Drawing Sheets

PUSH BUTTON SWITCHING SYSTEM AND METHOD

CROSS-REFERENCE TO RELATED APPLICATION

This application is a divisional application of U.S. application Ser. No. 09/190,198, filed Nov. 12, 1998 and now U.S. Pat. No. 5,941,372.

BACKGROUND OF THE INVENTION

This invention relates to a push button switch assembly and method and, more particularly, to such an assembly and method according to which a membrane switch is manually actuated.

Many forms of push button switches are in the prior art, and several involve manual actuation of a membrane switch. These latter designs includes an opposing pair of flexible electrodes separated by a dielectric layer. A plurality of integral outwardly-extending protrusions are screen printed on the exterior surface of each electrode, one over each of the opposing contact portions to concentrate an applied force to bring the respective electrode contact portions together into electrical contact. This assembly will hereinafter be referred to as the "membrane", and the switch is activated, or closed, by pushing on a selected area of the membrane.

Some push button switches of the above type include an enlarged pivotal button which is manually pushed towards the membrane to activate the switch. An enlargement, or bumper, is provided on the back side of the button and is often provided with a domed, or rounded, end for engaging the membrane. In this manner, the button provides a relatively large contact area for manual engagement, while the bumper engages the relatively small, critical area of the membrane that activates the switch.

However, there are problems associated with this type of assembly. For example, the button and the associated bumper are usually fabricated integrally of hard plastic. Therefore, when a relatively large force, such as 40–50 pounds, is applied to the button, and the force is transmitted by the bumper to the membrane, it can damage the membrane.

Another problem with this type of switch occurs when the switch is located in an outdoor environment, such as a gasoline dispensing station located at a service station, and is therefore subjected to relatively low temperatures. In these environments, even if the bumper is fabricated of a soft material, such as an elastomer, to avoid the transmission of excessive forces as discussed above, this material will be subjected to a compression set at relatively low temperatures. As a result, after a few cycles of use, the bumper will not reach the membrane, or at least will not reach it with sufficient force to actuate the switch.

Therefore, what is needed is a switching assembly of the above type which does not damage the membrane when relatively high forces are applied to the button, and is operable at relatively low temperatures.

SUMMARY OF THE INVENTION

Therefore, the switch assembly of the present invention includes a button mounted to a partition and having at least one hook for engaging a ledge of the partition. The button also includes at least one post extending through an opening in the partition and fastened to the partition for mounting the button to the partition for pivotal movement which is limited by the engagement of the hook with the ledge. A membrane switch is mounted on the partition, and a bumper extends from the button for engaging the membrane of the switch to activate same.

According to the switch assembly and method of the present invention, there is no damage to the membrane when relatively high forces are applied to the button, and the switch assembly is operable at relatively low temperatures.

DETAILED DESCRIPTION OF THE PREFERRED EMBODIMENT

Figure 1:
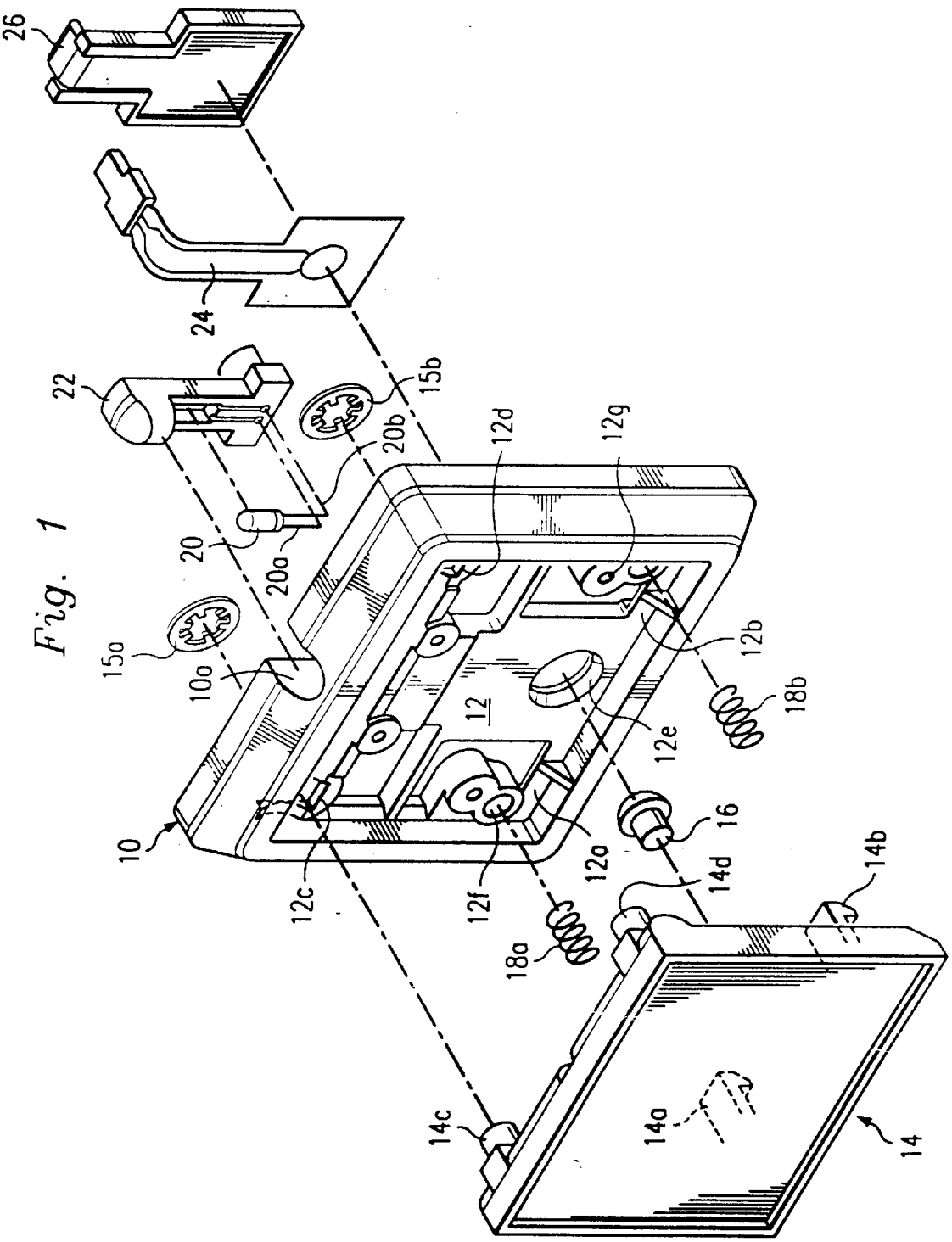
FIG. 1 is an exploded isometric view of the switch assembly of the present invention.
Figure 2:
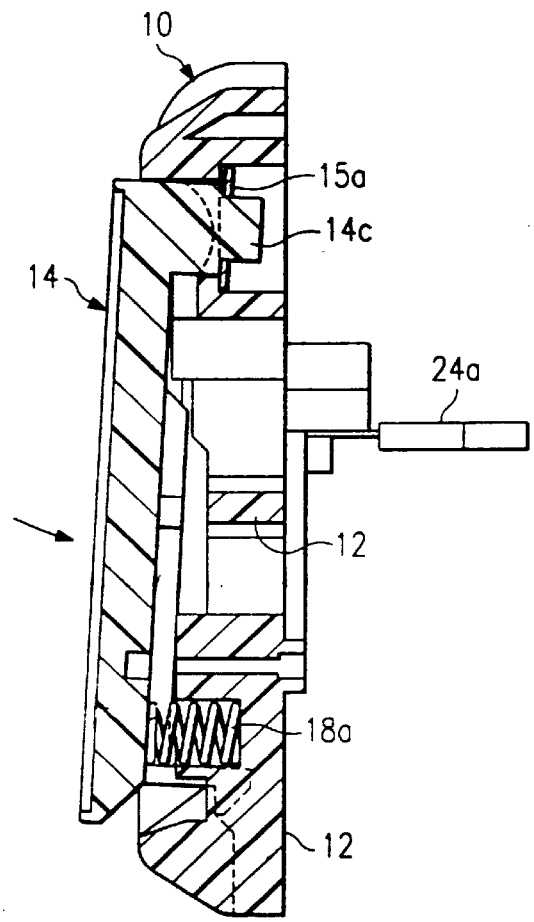
FIGS. 2 and 3 are sectional views of the switch assembly of FIG. 1 showing the components of FIG. 1 in an assembled condition.
Figure 3:
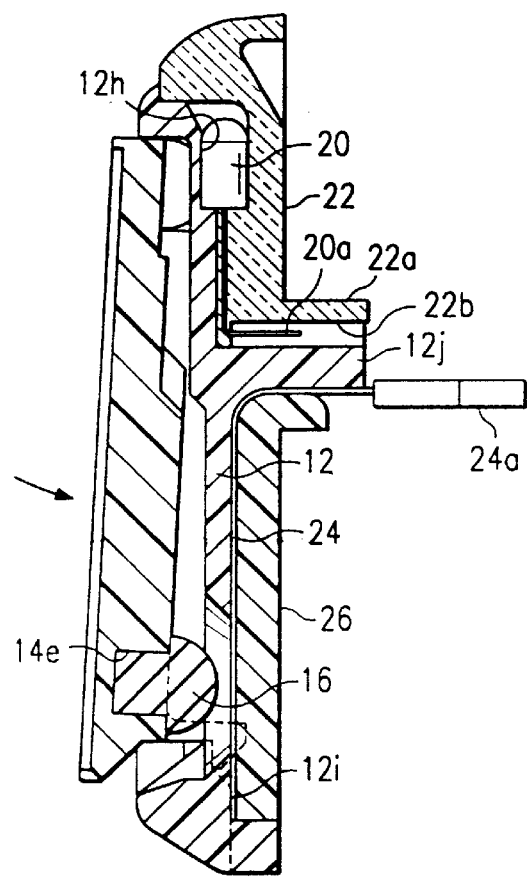

The switch assembly of the present invention is shown in FIGS. 1–3 of the drawings and includes a housing 10 having a recessed, perforated partition 12 extending therein against which a push button 14 extends. The front face of the button 14 is solid to define a relatively large surface to be pushed when the switch is activated, The partition 12 defines two ledges 12a and 12b which respectively receive two hooks 14a and 14b extending from the back face of the button 14.

Two posts 14c and 14d also extend from the back face of the button 14 and through two openings 12c and 12d formed through the partition 12. A pair of retaining rings 15a and 15b engage the distal end portions of the posts 14c and 14d, respectively to secure the upper portion of the button 14, as viewed in the drawings, to the partition 12.

A central through opening 12e is provided through the partition 12 for receiving a bumper 16, and two counter bored holes 12f and 12g are provided in the partition for receiving a pair of springs 18a and 18b, respectively. An opening 14e (FIG. 3) is provided in the back face of the button 14 for receiving the bumper 16.

A light emitting diode (LED) 20 (FIGS. 1 and 3) is mounted in a holder 22 which, in turn, is mounted in a slot 10a (FIG. 1) in the housing 10 and extending through the back face of the partition 12. As shown in FIG. 3, the LED 20 protrudes slightly from the holder 22 and extends in a recessed slot 12h in the back face of the partition 12. A membrane switch 24 is mounted to a holder 26 which is also mounted in a slot 12i (FIG. 3) also formed in the back face of the partition 12 and extending just below the holder 22.

A ledge 12j (FIG. 3) extends from the back side of the partition 12 and receives a flange 22a formed on the lower end of the LED holder 22. Two electrical conductors 20a and 20b (FIG. 1) extend from the LED 20 and, as shown in FIG. 3 in connection with the conductor 20a, the conductors extend between the adjacent surfaces of the partition 12 and the holder 22 and are bent at a right angle so that they extend into a slot 22b formed in the flange 22a of the holder 22. This positions the conductors 20a and 20b to be connected to a "push" type electrical connector (not shown) extending from a wiring harness, or the like and adapted to push directly on to the conductors. The membrane switch 24 has a tail 24a that extends outwardly from the holder 26 and is also connected to the latter wiring harness.

The button 14 is mounted to the housing 10 by inserting the hooks 14a and 14b of the button 14 over the ledges 12a and 12b of the partition 12, and then extending the posts 14a and 14b through the openings 12c and 12d, respectively, of the partition. The retaining rings 15a and 15b are attached to the distal end portions of the posts 14a and 14b, respectively to secure the upper portion of the button 14 to the partition 12. As shown in FIG. 2, the springs 18a and 18b urge the lower end portion of the button 14 outwardly from the partition 12, causing a pivotal movement of the button about the secured posts 14c and 14d, with the engagement of the hooks 14a and 14b with the ledges 12a and 12b, respectively, limiting this outwardly pivotal movement to a relatively short distance.

The button 14 is activated by pushing the lower end of the button towards the partition 12 in the direction shown by the arrows in FIGS. 2 and 3 against the force of the springs 18a and 18b. This causes pivotal movement of the lower end of the button 14 towards the lower end of the partition 12 until the bumper 16 engages the membrane switch 24, and the back face of the lower end of the button contacts the front face of the lower end of the partition. After the springs have been compressed an additional, relatively short, distance, such as 0.020 to 0.050 inches, the switch 24 is activated to close an electrical circuit (not shown) in a conventional manner, which circuit would also be connected to the above wiring harness. In addition, the activation of the switch 24 can be used to change the electrical signal to the LED 20 to provide visual indication that the circuit has been closed.

According to another feature of the present invention the bumper 16 is fabricated from a silicon rubber which compresses when it engages the membrane switch 24 and thus minimizes damage to the membrane switch 24 when relatively high pushing forces are applied to the button 14. In addition, silicon rubber is not subjected to a compression set unless the ambient temperature reaches an extremely low value, which is approximately minus 60 degrees F.

As a result, according to the switch assembly and method of the present invention, there is no damage the membrane when relatively high forces are applied to the button, and the switch assembly is operable at relatively low temperatures and is thus well-suited for outdoor use. Also, the ends of the conductors 20a and 20b of the LED can easily be engaged directly by the above-mentioned electrical connector thereby negating the requirement of a separate electrical terminal on the latter conductors.

It is understood that modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method of activating a membrane switch, comprising the steps of mounting the switch on a partition, pivotally mounting a button to the partition, normally urging the button away from the partition, and providing a bumper of a soft material on the button that engages and actuates the switch through an opening in the partition when the button is pushed towards the partition, wherein the soft material compresses to minimize damage to the membrane switch while engaging the switch.

2. The method of claim 1 further comprising the step of fabricating the bumper of a material that is not subject to a compression set at temperatures above minus 60 degrees F.

3. A method for activating a membrane switch in a push button assembly, comprising the steps of:

mounting the switch on one side of a partition;

pivotally mounting on another side of the partition a button with two posts by which an upper portion of the button is secured to the partition;

providing at least one spring between the partition and the lower portion of the button to normally urge a lower portion of the button away from the partition;

providing at least one hook on the lower portion of the button engaged to at least one ledge on the partition to limit the maximum distance between the lower portion of the button being urged away and the partition; and providing a bumper of a soft material on the button that engages the switch to actuate same when the button is pushed towards the partition, wherein the soft material compresses when it contacts the switch to minimize damage to the switch.

4. The method of claim 3 wherein the bumper engages the switch by going through an opening in the partition while the button is pushed.

5. A method for operating a push button switch assembly, the method comprising the steps of:

providing a partition having at least one ledge and at least one through opening;

engaging at least one hook on the button to the at least one ledge;

extending at least one post of the button through the opening for fastening the button to the partition while permitting slight pivotal movement of the button relative to the partition which is limited by the engagement of the hook with the ledge;

mounting a membrane switch on the partition; and engaging a bumper extending from the button with the membrane of the switch to activate same.

6. The method of claim 5 wherein the post and the through opening are located at one end portion of the button and the partition, respectively, and wherein the button pivots relative to the partition about the post.

7. The method of claim 6 where the hook and the ledge are located at the other end portion of the button and the partition, respectively, so that the other end portion of the button moves relative to the other end portion of the partition.

8. The method of claim 7 wherein at least one spring extends between the button and the partition to normally urge the other end portion of the button away from the other end portion of the partition.

9. The method of claim 7 wherein the bumper is located on the other end portion of the button and a through opening is formed through the other end portion of the partition through which the bumper extends when the other end portion of the button is pushed towards the other end portion of the partition.

10. The method of claim 9 wherein the back face of the button engages the front face of the partition and wherein the switch is mounted on the back side of the partition and is engaged by the bumper after it passes through the latter through opening in the partition.

11. The method of claim 10 wherein the partition has a slot formed thereon for receiving a holder in order to accommodate the switch.

12. The method of claim 5 wherein the partition has an LED mounted thereon for lighting when the switch is activated by the button.

13. The method of claim 5 wherein the partition further includes a holder for receiving the LED and a slot formed in the partition for receiving the holder.

14. The method of claim 13 wherein the bumper is fabricated of a soft material that engages the switch.

15. The method of claim 14 wherein the soft material is a silicone rubber.

* * * * *